(12) United States Patent
Yamazaki et al.

(10) Patent No.: US 7,855,596 B2
(45) Date of Patent: Dec. 21, 2010

(54) DEMODULATION CIRCUIT

(75) Inventors: Daisuke Yamazaki, Kawsaski (JP); Kunihiko Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/129,454

(22) Filed: May 29, 2008

(65) Prior Publication Data

US 2008/0224766 A1 Sep. 18, 2008

Related U.S. Application Data

(63) Continuation of application No. PCT/JP2005/021990, filed on Nov. 30, 2005.

(51) Int. Cl.
 *H03D 1/00* (2006.01)
(52) U.S. Cl. .................. 329/369; 329/370; 340/10.1
(58) Field of Classification Search ........... 329/347, 329/369, 370; 340/10.1, 10.34
 See application file for complete search history.

(56) References Cited

U.S. PATENT DOCUMENTS 6,323,728 B1 * 11/2001 Schmitt-Landsiedel et al. .......... 329/347

FOREIGN PATENT DOCUMENTS

| JP | 59-73857 U | 5/1984 |
|----|------------|--------|
| JP | 9-168037 A | 6/1997 |
| JP | 2004-140681 A | 5/2004 |
| JP | 3553502 B2 | 5/2004 |
| JP | 2004-350322 A | 12/2004 |
| JP | 2005-142778 A | 6/2005 |

* cited by examiner

*Primary Examiner*—Robert Pascal
*Assistant Examiner*—James E Goodley
(74) *Attorney, Agent, or Firm*—Fujitsu Patent Center

(57) ABSTRACT

A modulation ratio enhancement circuit increases the modulation ratio of a current signal which is ASK-modulated with signal data. A branch unit, an average value detection unit, a comparator and a buffer constitute a demodulation unit so that the signal data is demodulated from a current signal of which the modulation ratio is increased by the modulation ratio enhancement circuit.

8 Claims, 24 Drawing Sheets

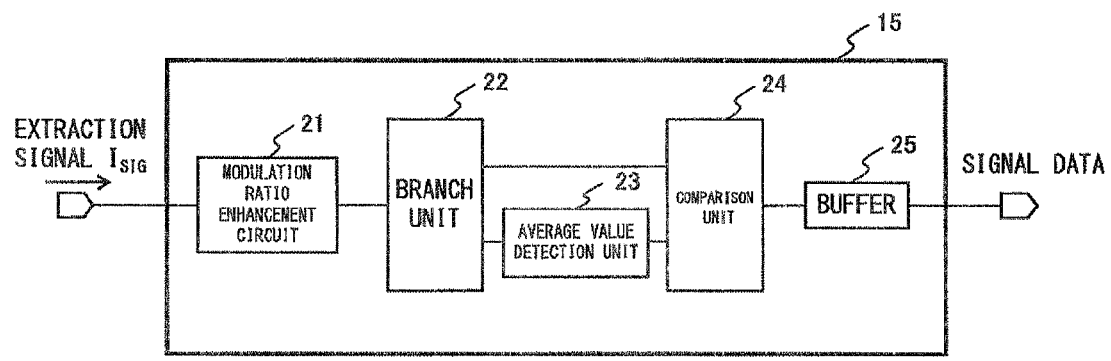
F I G. 6

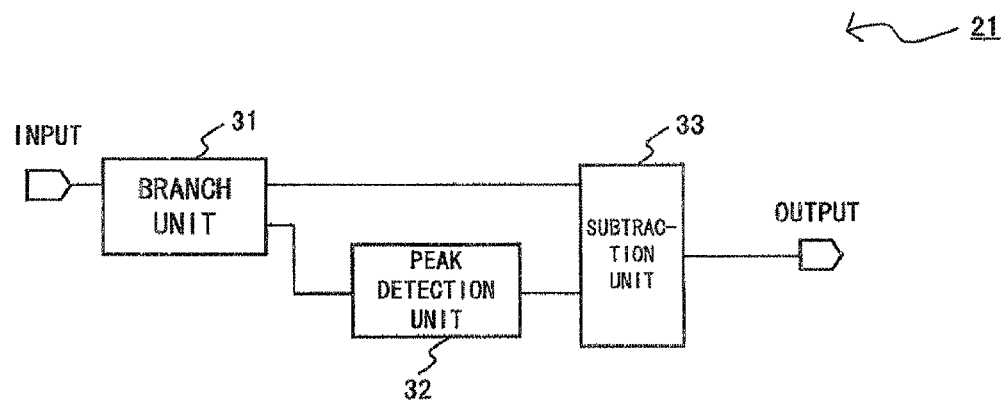
F I G. 7

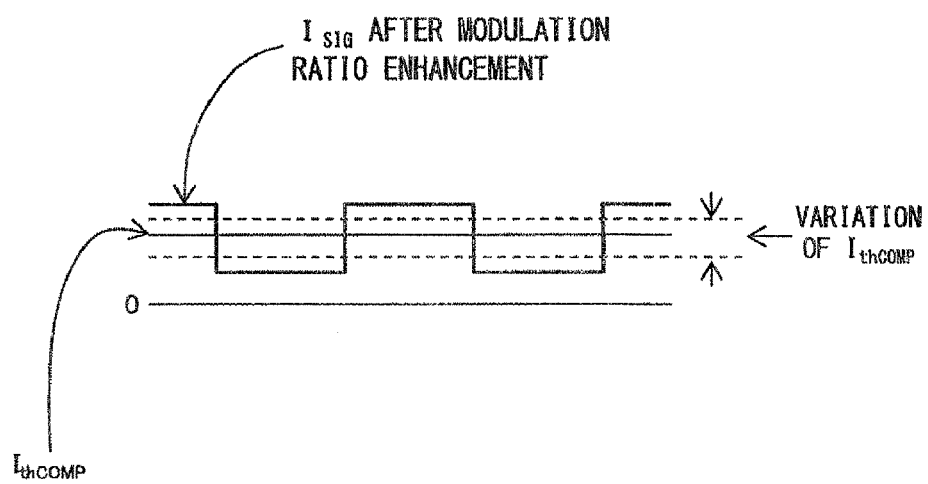
F I G. 8B

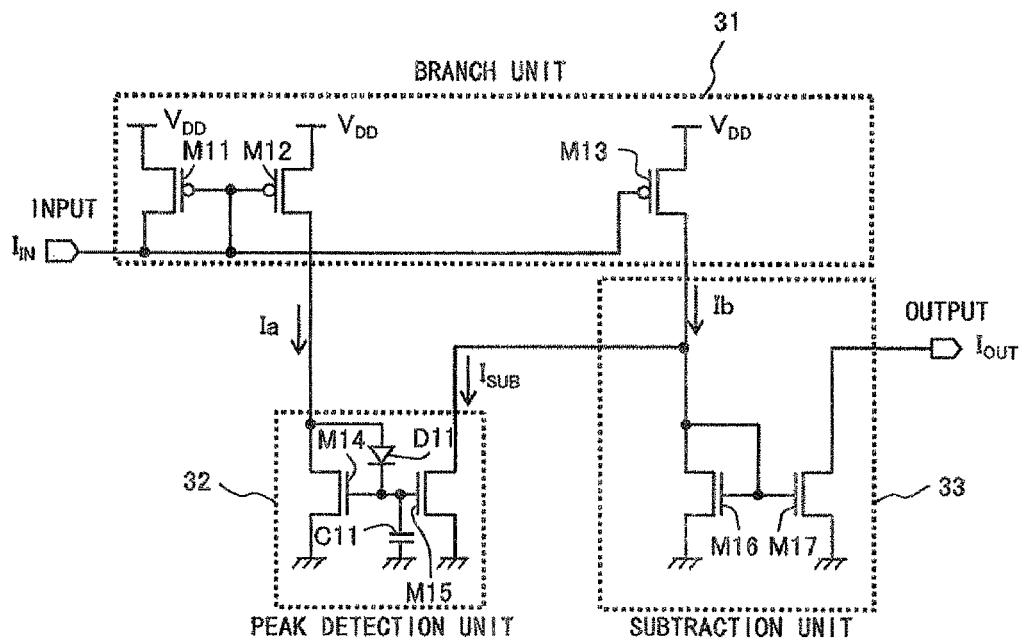
F I G. 9A

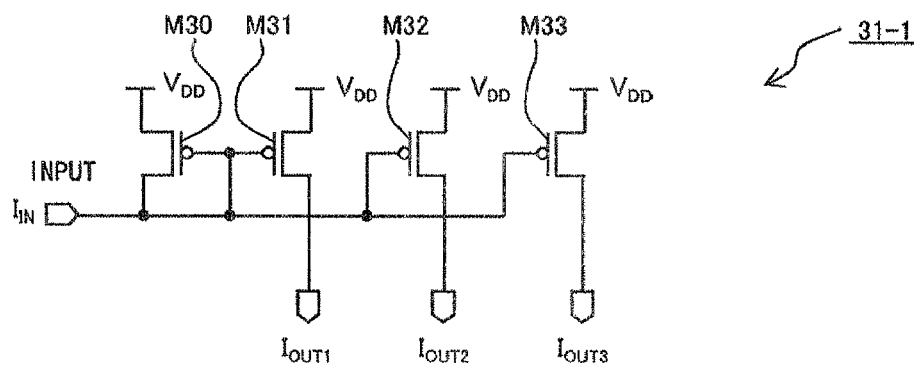
F I G. 12

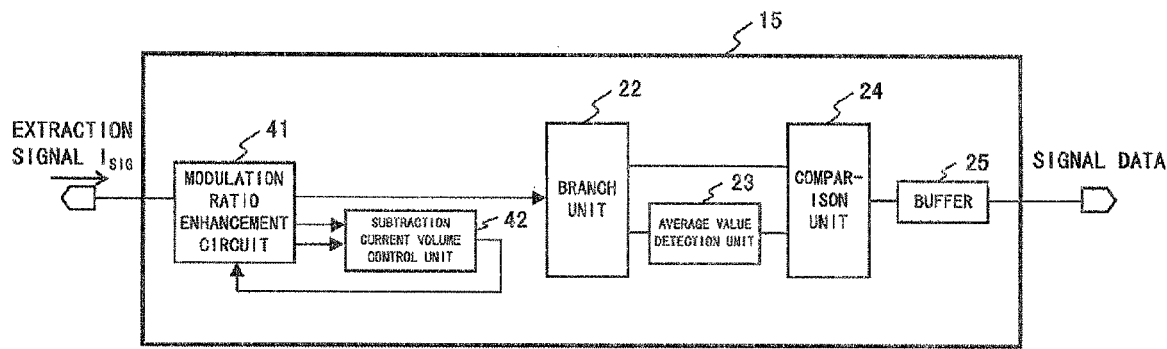
F I G. 14

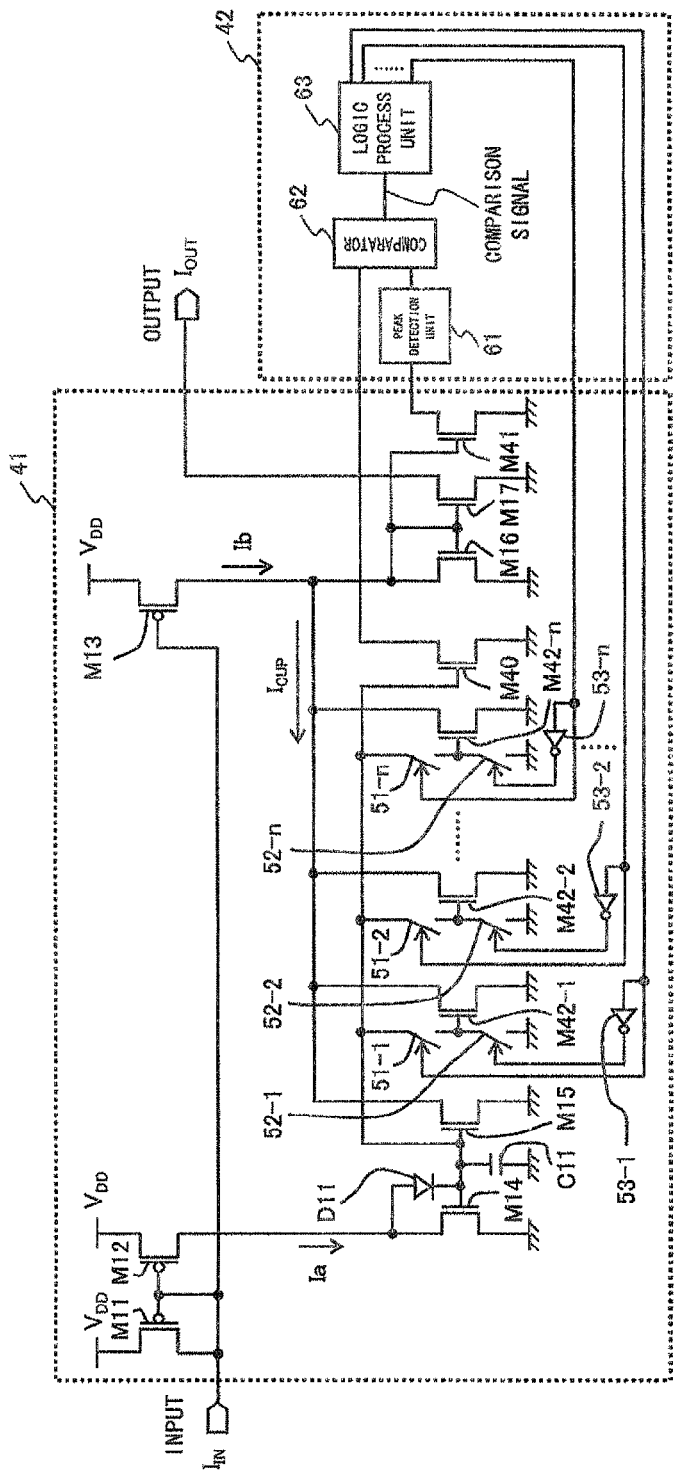
F I G. 15

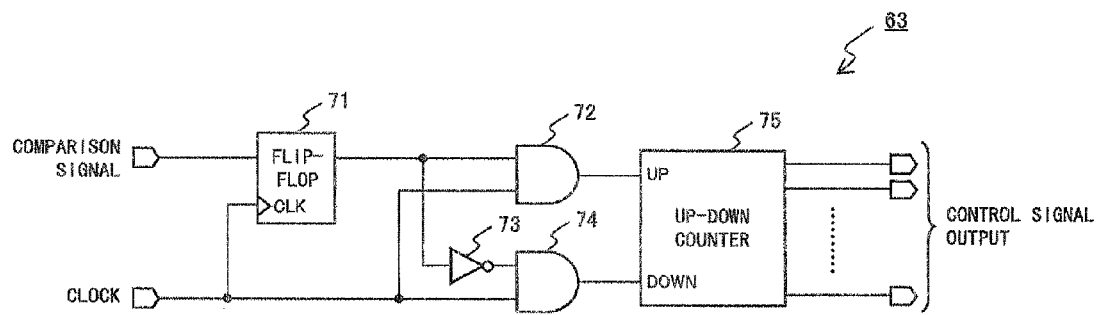
F I G. 16

DEMODULATION CIRCUIT

CROSS REFERENCE TO RELATED APPLICATION

This application is a continuation application of international PCT application No. PCT/JP2005/021990 filed on Nov. 30, 2005.

BACKGROUND OF THE INVENTION

1. Field of the Invention

The present invention relates to a technique for obtaining original signal data by demodulating a signal which is modulated by signal data, and in particular to a technique suitably applicable to an apparatus.

2. Description of the Related Art

As an example, a technique for obtaining original signal data by comparing the magnitude of an original modulation signal with that of the threshold value generated from the average value of a modulation signal is known as a technique for demodulating a modulation signal which is ASK (Amplitude Shift Keying)-modulated by signal data.

FIG. 1 is a block diagram showing the configuration of a conventional demodulation circuit for demodulating an ASK modulation signal.

In the reception unit 100 shown in FIG. 1, a demodulation circuit 110 applies an ASK demodulation to the electric current value (an electric current is noted as "current" hereinafter) of the line L detected by a current detection unit 101. The demodulated signal is inverse-diffused to be spectrum diffusion-demodulated by a spectrum diffusion modulation unit 105 on the basis of a pseudo noise (PN) code generated by a PN code generation unit 104, and an inverse diffusion demodulation signal is output. In the meantime, a differential value detection unit 106 calculates the differential value of the aforementioned current value of the line L relative to the average value of the current value of the line L, and a weighting calculation unit 107 adds a weighting to the inverse diffusion demodulation signal on the basis of the differential value. Following the weighting, an integration unit 108 further integrates the inverse diffusion demodulation signal for each one symbol minute of transmission data so that a data judgment unit 109 performs a binary-judgment of the integration value to obtain the reception data.

The demodulation circuit 110 comprises an average value detection unit 102 and a comparison unit 103.

The average value detection unit 102 calculates and outputs the average value of the current value flowing in the line L. The comparison unit 103 compares the magnitude of the aforementioned average value output from the average value detection unit 102 with that of the current value flowing in the line L and outputs the comparison result as an ASK demodulation signal. Specifically, the comparison unit 103 uses the average value calculated by the average value detection unit 102 as reference value and outputs "1" if the current value flowing in the line L is no smaller than the aforementioned reference value and outputs "0" if it is smaller than the reference value.

Next is a description of FIG. 2 which exemplifies the specific circuit configuration of the demodulation circuit 110.

Referring to FIG. 2, all of transistors M101, M102 and M103 are p-MOS transistors and both of transistors M104 and M105 are n-MOS transistors.

A branch unit 111 generates a signal corresponding to a detection signal $I_{DET}$ which is ASK-modulated with signal data. The branch unit 111 comprises the transistors M101, M102 and M104. Here, the transistor M102 forms a current mirror in combination with the transistor M101 and sends a drain current equal to the current value of the detection signal $I_{DET}$ to the transistor M104. Therefore, a voltage, which is a constant value (noted as "constant" hereinafter) times the current value of the detection signal $I_{DET}$, is generated at the gate of the gate transistor M104 whose drain and gate are in short-circuit.

The average value detection unit 102, comprising a resistor R101 and a capacitor C101, averages the gate voltage of the transistor M104 and applies the averaged voltage, that is, the average of the voltage value which is a result of multiplying the current value of the detection signal $I_{DET}$ by a constant, to the comparison unit 103.

The comparison unit 103 comprises the transistors M103 and M105 and inverters 112 and 113. Here, the inverters 112 and 113 are serially connected together, thus constituting a buffer.

The transistor M103, forming a current mirror in combination with the transistor M101 of the branch unit 111, outputs a current $I_{SCOMP}$ equal to the current value of the detection signal $I_{DET}$. Meanwhile, the output voltage for the average value detection unit 102 is applied to the gate of the transistor M105 and therefore the transistor M105 applies the average value of the gate voltage of the transistor M104, that is, sends the average of the current value of the detection signal $I_{DET}$ as threshold current $I_{thCOMP}$. Therefore, the output of the comparison unit 103, that is, the output of the inverters 112 and 113, which constitute the buffer, becomes "1" (i.e., a "high" level) if the current $I_{SCOMP}$ is no smaller than the threshold current $I_{thCOMP}$, and becomes "0" (i.e., a "low" level) if the current $I_{SCOMP}$ is smaller than the threshold current $I_{thCOMP}$.

Since the demodulation circuit 110 shown in FIG. 2, operating as noted above, outputs "1" when the detection signal $I_{DET}$ is no smaller than the average value of the present detection signal $I_{DET}$, and outputs "0" when the detection signal $I_{DET}$ is smaller than the present average value, thereby possessing the function of demodulating an ASK modulation signal.

The relationship between the current $I_{SCOMP}$ and threshold current $I_{thCOMP}$ in the demodulation circuit 110 shown in FIG. 2 possibly varies if the characteristics among the transistors M101, M102 and M103 are not uniform and/or the characteristics between the transistors M104 and M105 are not uniform. The range of the variation of the threshold current $I_{thCOMP}$ relative to the current $I_{SCOMP}$ increases in proportion to the magnitude of the current value of the detection signal $I_{DET}$ input to the demodulation circuit 110. Because of this, when the current value of the detection signal $I_{DET}$ is large, even a change in the current $I_{SCOMP}$ does not possibly cause a change in the relationship in magnitude related to a varied threshold current $I_{thCOMP}$ if the ratio of the current amplitude (that is, the current amplitude of the detection signal $I_{DET}$) of the current $I_{SCOMP}$ to the peak value of the current $I_{SCOMP}$ (that is, the current value of the detection signal $I_{DET}$), this ratio is so-called a "modulation ratio", is small as shown in FIG. 3. In such a case, an ASK modulation signal cannot be demodulated.

Here, let it think the case of, for example, inputting a detection signal $I_{DET}$ to the demodulation circuit 110 after the signal being simply amplified in order to increase a current amplitude relative to the current $I_{SCOMP}$. FIGS. 4A and 4B respectively show the relationship between the current $I_{SCOMP}$ and threshold current $I_{thCOMP}$ prior to the amplification and the relationship between the current $I_{SCOMP}$ and threshold current $I_{thCOMP}$ after the amplification. As is clear from these figures, the inputting of the detection signal $I_{DET}$ to the demodulation circuit 110 after the signal is amplified certainly increases the current amplitude of the current $I_{SCOMP}$. In this case, however, the range of variation relative to the threshold current $I_{thCOMP}$ also increases in association of increasing the current amplitude of the current $I_{SCOMP}$, still disabling the demodulation of the ASK modulation signal.

SUMMARY OF THE INVENTION

According to one aspect of the present invention, a demodulation circuit comprises a modulation ratio enhancement unit for increasing the modulation ratio of a current signal which is amplitude shift keying (ASK)-modulated with signal data; and a demodulation unit for demodulating the signal data from the current signal, of which the modulation ratio is increased by the modulation ratio enhancement unit.

BRIEF DESCRIPTION OF THE DRAWINGS

The present invention will be more apparent from the following detailed description when the accompanying drawings are referenced.

FIG. 6 is a block diagram showing a first example of the configuration of a demodulation circuit embodying the present invention;

FIG. 7 is a block diagram showing the configuration of a modulation ratio enhancement circuit;

FIG. 8B is a diagram exemplifying the relationship between an extraction signal ISIG and the variation range of a threshold current $I_{thCOMP}$ after a modulation ratio enhancement;

FIG. 9A is a diagram showing a first example of the specific circuit configuration of a modulation ratio enhancement circuit;

FIG. 12 is a diagram exemplifying the specific circuit configuration of the branch circuit shown in FIG. 11;

FIG. 14 is a block diagram showing a fourth example of the configuration of a demodulation circuit embodying the present invention;

FIG. 15 is a diagram exemplifying the specific circuit configuration of the modulation ratio enhancement circuit and subtraction current volume control unit shown in FIG. 14; and FIG. 16 is a diagram exemplifying the specific circuit configuration of the logic control unit shown in FIG. 15.

DESCRIPTION OF THE PREFERRED EMBODIMENT

The following is a description of the preferred embodiment of the present invention by referring to the accompanying drawings.

Figure 5:
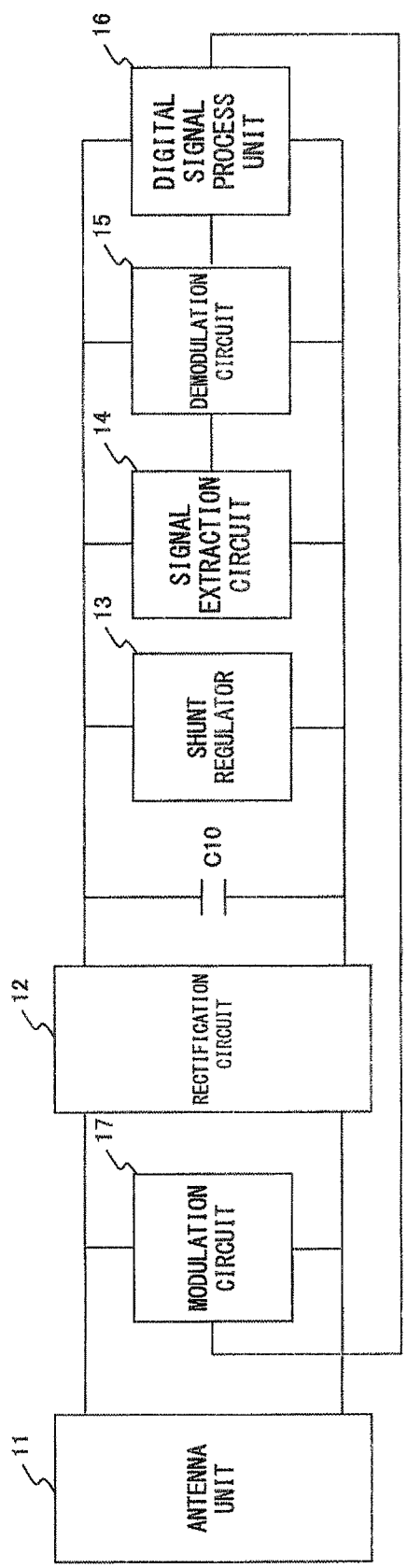
FIG. 5 is a diagram showing the configuration of a radio frequency identification (RFID) tag or a noncontact integrated circuit (IC) card comprising a demodulation circuit embodying the present invention.

First is a description of FIG. 5 which is a diagram showing the configuration of a radio frequency identification (RFID) tag which is a noncontact data carrier comprising a demodulation circuit embodying the present invention.

The RFID tag comprises an antenna unit 11, a rectification circuit 12, a charge capacitor C10, a shunt regulator 13, a signal extraction circuit 14, a demodulation circuit 15, a digital signal process unit 16 and a modulation circuit 17.

A signal received by the antenna unit 11 is rectified by the rectification circuit 12, followed by being charged in the charge capacitor C10 and turned into the power supply for the digital signal process unit 16. The shunt regulator 13 controls a short-circuit current volume in order to maintain the voltage of the power supply at constant.

The signal extraction circuit 14 extracts, as an electric current signal ("current signal" hereinafter), a reception signal (i.e., an ASK modulation signal) superimposed on the power supply signal. The demodulation circuit 15, being a circuit embodying the present invention, obtains the original signal data by demodulating the extracted reception signal.

The digital signal process unit 16 applies a prescribed signal process to the obtained signal data. The modulation circuit 17 modulates the impedance of the antenna unit 11 by way of the transmission signal generated by the digital signal process unit 16 and makes the antenna unit 11 emit the ASK-modulated radio frequency signal.

Note that a noncontact integrated circuit (IC) card comprising a demodulation circuit embodying the present invention can also be configured similarly to the RFID tag shown in FIG. 5.

Next is a description of FIG. 6 which is a block diagram showing a first example of the configuration of the demodulation circuit 15 embodying the present invention.

A signal $I_{SIG}$ extracted by the signal extraction circuit 14 is input to a modulation ratio enhancement circuit 21. The modulation ratio enhancement circuit 21 is a circuit for increasing the modulation ratio of an extraction signal ISIG which is ASK-modulated with signal data and is described later for its configuration.

The current signal output from the modulation ratio enhancement circuit 21 is input to a branch unit 22. The branch unit 22 generates a current signal corresponding to the inputted current signal and outputs it to an average value detection unit 23 and a comparison unit 24. The average value detection unit 23 calculates and outputs the average value of the signal input from the branch unit 22. The comparison unit 24 compares the magnitude of the aforementioned average value output from the average value detection unit 23 with that of the signal input from the branch unit 22. The comparison result is output by way of a buffer 25 as ASK-demodulated signal data.

Figure 1:
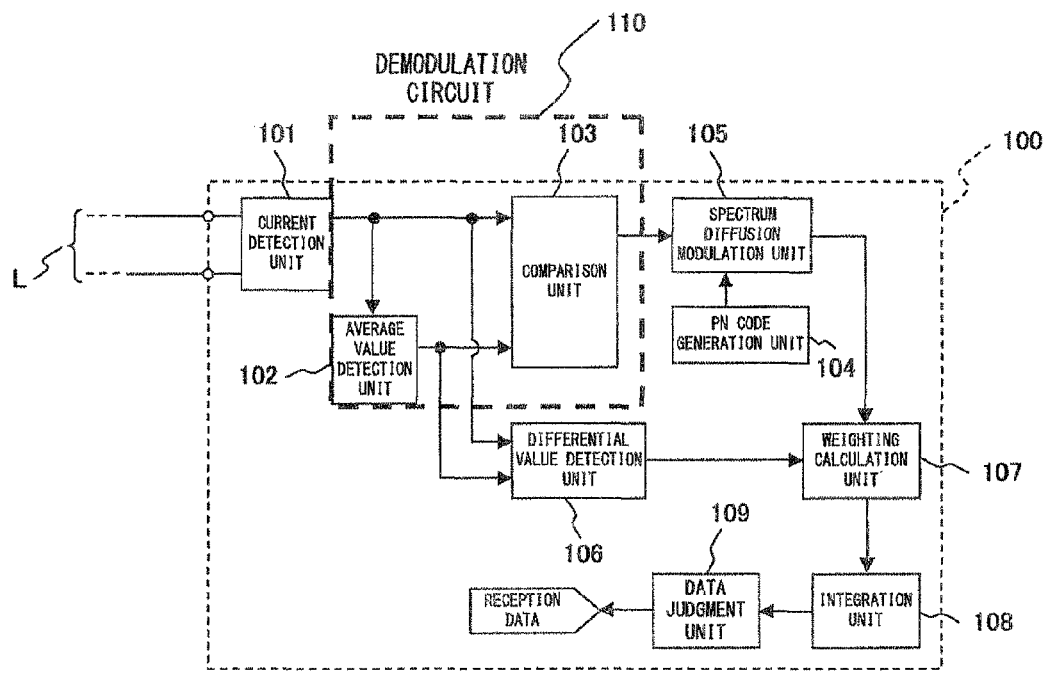
FIG. 1 is a block diagram showing the configuration of a conventional demodulation circuit for demodulating an ASK modulation signal.
Figure 2:
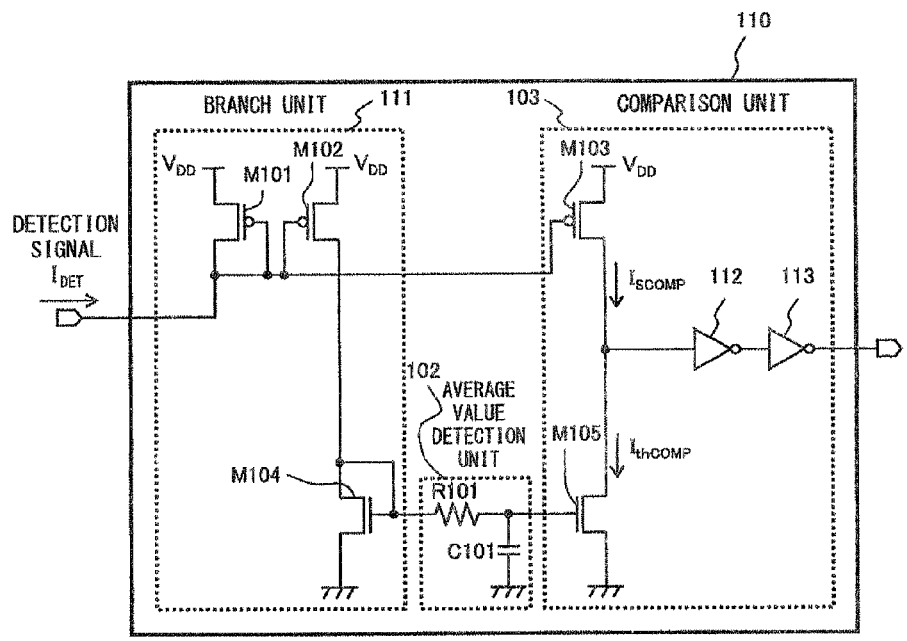
FIG. 2 is a diagram exemplifying the specific circuit configuration of the demodulation circuit shown in FIG. 1.

Note that the specific configurations of the branch unit 22, average value detection unit 23, comparison unit 24 and buffer 25 may be similar to the configurations of those used for the conventional demodulation circuit 110 shown in FIG. 2. That is, the branch unit 22, average value detection unit 23, comparison unit 24 and buffer 25 constitute a demodulation unit demodulating the original signal data from a current signal of which the demodulation ratio is increased by the modulation ratio enhancement circuit 21. The demodulation unit compares the magnitude of the average value of the current signal output from the modulation ratio enhancement circuit 21 with that of the aforementioned current signal and outputs the comparison result as an ASK demodulation signal.

Note that the configuration of the comparison unit 103 shown in FIG. 2 corresponds to the configuration as a result of combining the comparison unit 24 and buffer 25 which are shown in FIG. 6.

Next is a description of FIG. 7 which is a block diagram showing the configuration of a modulation ratio enhancement circuit 21.

A branch unit 31 generates the same current signal as the extraction signal $I_{SIG}$ which is ASK-modulated with the signal data and outputs it to a peak detection unit 32 and a subtraction unit 33.

The peak detection unit 32 detects the maximum value of the current signal (that is, the extraction signal $I_{SIG}$) input from the branch unit 31.

The subtraction unit 33 subtracts a subtraction current, which is a constant current of the current value as the result of multiplying a constant by the maximum value of the extraction signal $I_{SIG}$ detected by the peak detection unit 32, from the current signal (that is, the extraction signal $I_{SIG}$) input from the branch unit 31 and outputs the resultant current.

Figure 8A:
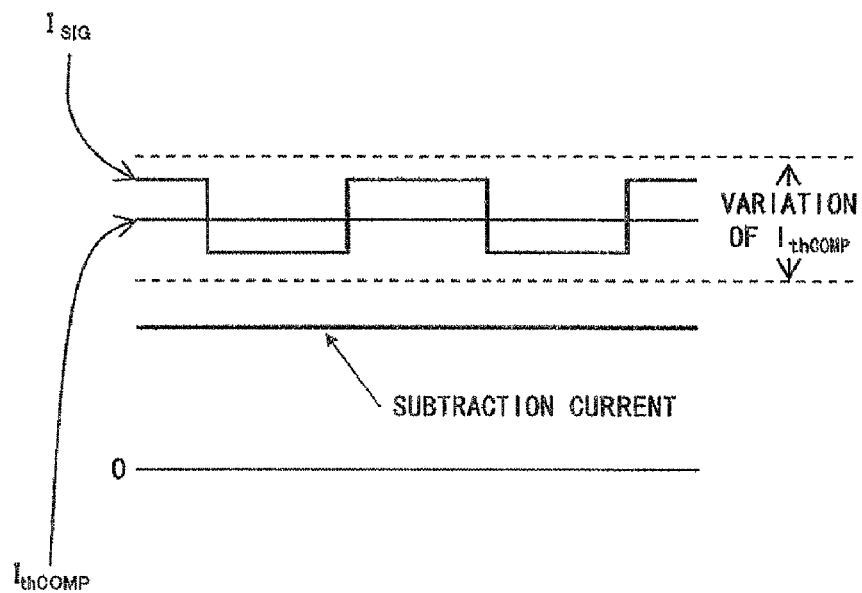
FIG. 8A is a diagram exemplifying the relationship between an extraction signal $I_{SIG}$ and the variation range of a threshold current $I_{thCOMP}$ before a modulation ratio enhancement.

Next is a description of the modulation ratio enhancement circuit 21 by referring to FIGS. 8A and 8B.

FIG. 8A exemplifies the relationship between an extraction signal $I_{SIG}$ and the variation range of a threshold current $I_{thCOMP}$ (refer to FIG. 2) at the comparison unit 24 before a modulation ratio enhancement. In the case of FIG. 8A, since the variation range of the threshold current $I_{thCOMP}$ is wide, there is possibly a case in which there is no change in magnitude of the current values relative to that of the threshold current $I_{thCOMP}$ for an extraction signal $I_{SIG}$ whose modulation ratio is small, depending on the amount of the aforementioned variation.

In contrast, FIG. 8B exemplifies the relationship between an extraction signal $I_{SIG}$ and the variation range of a threshold current $I_{thCOMP}$ (refer to FIG. 2) after a modulation ratio enhancement. The extraction signal $I_{SIG}$ after the modulation ratio enhancement shown in FIG. 8B is the result of subtracting the subtraction current shown in FIG. 8A from the extraction signal $I_{SIG}$ before the modulation ratio enhancement.

This subtraction results in making the peak value of the extraction signal $I_{SIG}$ small while maintaining the current amplitude thereof and therefore the modulation ratio (i.e., the current amplitude divided by the peak value) increases while the current value of the extraction signal $I_{SIG}$ decreases. On the other hand, the variation range of the threshold current $I_{thCOMP}$ relative to the current $I_{SIG}$ is proportional to the magnitude of the current value of a current $I_{SIG}$ input to the demodulation unit and therefore the variation range of the threshold current $I_{thCOMP}$ decreases with a decrease in the current value of the extraction signal $I_{SIG}$, as described above. Therefore, a narrowing of the variation range down to a degree shown in FIG. 8B makes it possible to cause a change in the relationship of magnitudes between the extraction signal $I_{SIG}$ and threshold current $I_{thCOMP}$ relative to the change in the extraction signal $I_{SIG}$.

Figure 9B:
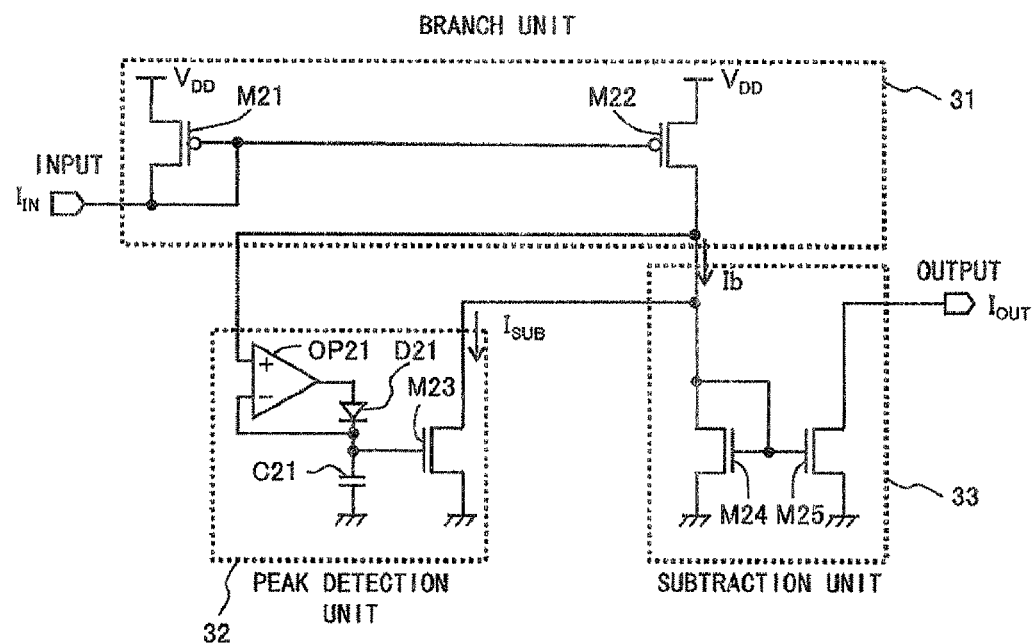
FIG. 9B is a diagram showing a second example of the specific circuit configuration of a modulation ratio enhancement circuit.

Next is a description of FIGS. 9A and 9B, both of which exemplify the specific circuit configuration of the modulation ratio enhancement circuit 21.

First is a description of a first example shown in FIG. 9A.

Referring to FIG. 9A, all of transistors M11, M12 and M13 are p-MOS transistors, while all of transistors M14, M15 M16 and M17 are n-MOS transistors.

The branch unit 31 comprises the transistors M11, M12 and M13. A power supply voltage Vdd supplied from the rectification circuit 12, which is the power supply, is applied to the respective sources of the transistors M11, M12 and M13. Further, the respective gates of the transistors M11, M12 and M13 are connected to the drain of the transistor M11, and each of the transistors M12 and M13 forms a current mirror in combination with the transistor M11. Here, the current signal $I_{IN}$ (that is, the extraction signal $I_{SIG}$) input to the modulation ratio enhancement circuit 21 flows between the source and drain of the transistor M11 and therefore the transistors M12 and M13 respectively generate mirror currents Ia and Ib, which are equal to the current value of the current signal $I_{IN}$, and send them from the respective drains.

The peak detection unit 32 comprises the transistors M14 and M15, a diode D11 and a capacitor C11. Here, the drain of the transistor M14 is connected to the anode of the diode D11, and the respective gates of the transistors M14 and M15, the cathode of the diode D11 and one end of the capacitor C11 are connected together. Further, the respective sources of the transistors M14 and M15 and the other end of the capacitor C11 are connected to a ground node.

The drain of the transistor M12 comprised by the branch unit 31 is connected to the connection point between the drain of the transistor M14 and the anode of the diode D11, and therefore the mirror current Ia flows therein. A portion of the mirror current Ia passes through the diode D11 and charges the capacitor C11, increasing the gate voltage of the transistor M14. Thereafter when the gate voltage and drain voltage of the transistor M14 becomes identical, causing the diode D11 to transition to the Off state and thus the entirety of the current Ia flows between the drain and source of the transistor M14 toward the ground node. Here, the respective gates of the transistors M14 and M15 are connected together and therefore the gate voltage of them is identical. Therefore, the current (i.e., the subtraction current) $I_{SUB}$ flowing between the drain and source of the transistor M15 toward the ground node becomes a constant times the mirror current Ia. Here, the aforementioned constant is determined by the relationships of gate widths and gate lengths between the transistors M14 and M15.

Here, the mirror current Ia increases with the current value of the signal $I_{IN}$. This prompts the drain voltage of the transistor M14 to increase temporarily to be higher than the gate voltage, making the diode D11 transition to the On state. This in turn prompts a portion of the mirror current Ia to pass through the diode D11 to further charge the capacitor C11, thus further increasing the gate voltage of the transistor M14. When the gate voltage and drain voltage of the transistor M14 becomes identical in due course, the diode D11 transitions to the Off state again, followed by the state in which the entirety of the mirror current Ia flows between the drain and source of the transistor M14 toward the ground node. Also in this event, the subtraction current $I_{SUB}$ is the aforementioned constant times the mirror current Ia.

On the other hand, the mirror current Ia decreases with a decrease in the current value of the signal $I_{IN}$. In this event, the drain voltage of the transistor M14 decreases to the lower than the gate voltage, maintaining the diode D11 at the Off state. In this event, the gate voltage of the transistor M15 is maintained, by virtue of the function of the capacitor C11, at the voltage value before the current value of the current signal $I_{IN}$ is decreased and therefore the current value of the subtraction current $I_{SUB}$ is maintained at the value of the subtraction current $I_{SUB}$ before the current signal $I_{IN}$ is decreased.

By operating as described above, the peak detection unit 32 detects the maximum value of a current signal $I_{IN}$ (that is, extraction signal $I_{SIG}$) and obtains a subtraction current $I_{SUB}$ as the aforementioned constant times the present maximum value.

The subtraction unit 33 comprises the transistors M16 and M17. The respective gates of the transistors M16 and M17 are connected to the drain of the transistor M16, and thereby a current mirror is formed. Here, the mirror current flowing between the drain and source of the transistor M17 constitutes a current signal $I_{OUT}$ which is the output of the modulation ratio enhancement circuit 21. The respective sources of the transistors M16 and M17 are connected to the ground node.

The drain of the transistor M13 comprised by the branch unit 31 and that of the transistor M15 comprised by the peak detection circuit 32 are connected to the drain of the transistor M16. Here, the transistor M13 sends a mirror current Ib (that is, current signal $I_{IN}$) from the drain and the transistor M15 sends a subtraction current $I_{SUB}$ into the drain of the transistor M15, and therefore a current ($I_{IN}$–$I_{SUB}$) as a result of subtracting the subtraction current $I_{SUB}$ from the current signal $I_{IN}$ flows into the drain of the transistor M16. Therefore, the current flowing between the drain and source of the transistor M17 also results in the current ($I_{IN}$–$I_{SUB}$) of the result of the subtraction, and the current becomes an output current signal $I_{OUT}$.

By operating as described above, the subtraction unit 33 performs the subtraction in which the subtraction current $I_{SUB}$, which is the present constant times the maximum value of the current signal $I_{IN}$ (that is, the extraction signal $I_{SIG}$) is subtracted from the mirror current Ib of the aforementioned current signal $I_{IN}$.

Next is a description of the second example shown in FIG. 9B.

Referring to FIG. 9B, both of transistors M21 and M22 are p-MOS transistors, while all of transistors M23, M24 and M25 are n-MOS transistors.

The branch unit 31 comprises the transistors M21 and M22. A power supply voltage Vdd supplied from the rectification circuit 12, which is the power supply, is applied to the respective sources of the transistors M21 and M22. The respective gates of the transistors M21 and M22 are connected to the drain of the transistor M21, thereby the transistor M22 forming a current mirror in combination with the transistor M21. Here, the current signal $I_{IN}$ (that is, the extraction signal $I_{SIG}$) input to the modulation ratio enhancement circuit 21 flows between the source and drain of the transistor M21 and therefore the transistor M22 generates a mirror current equal to the current value of the current signal $I_{IN}$ and sends it from the drain.

The peak detection unit 32 comprises an operational amplifier OP21, the transistor M23, a diode D21 and a capacitor C21. Here, the output of the operational amplifier OP21 is connected to an anode of the diode D21. Further, the negative-side input of the operational amplifier OP21 is connected to a cathode of the diode D21, the gate of the transistor M23 and one end of the capacitor C21. Note, the source of the transistor M23 and the other end of the capacitor C21 are connected to a ground node.

Further, the subtraction unit 33 comprises the transistors M24 and M25. The respective gates of the transistors M24 and M25 are connected to the drain of the transistor M24 and thereby a current mirror is formed. Here, the mirror current Ib flowing between the drain and source of the transistor M25 constitutes a current signal $I_{OUT}$ which is the output of the modulation ratio enhancement circuit 21. Note that the respective sources of the transistors M24 and M25 are connected to the ground node.

The drain of the transistor M22 comprised by the branch unit 31 is connected to the positive-side input of the operational amplifier OP21 and the drain of the transistor M23, both of which are comprised by the peak detection unit 32, and to the drain of the transistor M24 comprised by the subtraction unit 33. Here, the positive-side input of the operational amplifier OP21 has high impedance and therefore very little current flows thereto. Therefore, it can be considered that the entirety of the mirror current Ib (that is, the current signal $I_{IN}$) sent from the drain of the transistor M22 flows between the drain and source of the transistors M23 and M24.

Here, a voltage Va, which is generated by the mirror current Ib flowing between the drain and source of the transistors M23 and M24, is applied to the positive-side input of the operational amplifier OP21. The voltage Va is a value of a constant times the mirror current Ib. The constant is determined by the characteristics of the transistors M23 and M24.

The application of the voltage Va to the positive-side input of the operational amplifier OP21 causes it to be at higher potential than the negative-side input thereof, making the output voltage of the operational amplifier OP21 being positive. This prompts the current flowing from the output of the operational amplifier OP21 to pass through the diode D21 and charge the capacitor C21, thereby increasing the voltage at the negative-side input of the operational amplifier OP21. Then, if the voltage at the negative-side input of the operational amplifier OP21 exceeds the voltage Va at the positive-side input thereof even a little, the output voltage of the operational amplifier OP21 immediately changes to negative. This prompts the diode D21 to shifts to the Off state. The voltage Va of the negative-side input of the operational amplifier OP21 in this event is also applied to the gate of the transistor M23, and therefore the current (i.e., the subtraction current) $I_{SUB}$ being flown between the drain and source of the transistor M23 toward the ground node results in a constant times the voltage Va. Note that the constant is determined by the characteristic of the transistor M23.

Here, the mirror current Ib increases with the current value of the signal $I_{IN}$. This prompts the voltage Va applied to the positive-side input of the operational amplifier OP21 to increase to be temporarily at a higher potential than the negative-side input thereof, thus making the output voltage of the operational amplifier OP21 being positive. This in turn prompts the diode D11 to transition to the On state and the current flowing from the output of the operational amplifier OP21 to pass through the diode D21 and charge the capacitor C21 further, thereby causing the voltage at the negative-side input of the operational amplifier OP21 to start increasing again. Thereafter, if the voltage at the negative-side input of the operational amplifier OP21 exceeds the voltage Va at the positive-side input thereof even a little, the output voltage of the operational amplifier OP21 immediately changes to negative, thus making the diode D21 transition to the Off state. Also in this case, the subtraction current $I_{SUB}$, which is the aforementioned constant times the voltage Va, flows between the drain and source of the transistor M23 toward a ground node.

On the other hand, the mirror current Ib decreases with a decrease in the current value of the signal $I_{IN}$. In this case, the voltage Va applied to the positive-side input of the operational amplifier OP21 decreases to be lower potential than that of the negative-side input thereof and therefore the output voltage of the operational amplifier OP21 remains to be negative. Therefore, the diode D21 is maintained in the Off state. In this event, the gate voltage at the transistor M23 is maintained, by virtue of the function of the capacitor C21, at the voltage Va before the current value of the current signal $I_{IN}$ is decreased, and therefore the current value of the subtraction current $I_{SUB}$ is maintained at the value of the subtraction current $I_{SUB}$ before the decrease in the current signal $I_{IN}$.

By operating as described above, the peak detection unit 32 detects the maximum value of the current signal $I_{IN}$ (that is, extraction signal $I_{SIG}$) and obtains the subtraction current $I_{SUB}$ as the present times the aforementioned maximum value.

In the subtraction unit 33, the transistors M24 and M25 are configured in a manner similar to the transistors M16 and M17, which are shown in FIG. 9A, and therefore the subtraction unit 33 operates in the similar manner to the subtraction unit 33 in the configuration of FIG. 9A, resulting in performing a subtraction in which a subtraction current $I_{SUB}$, i.e., the present times the maximum value of the current signal $I_{IN}$ (that is, the extraction signal $I_{SIG}$), is subtracted from the mirror current Ib of the aforementioned current signal $I_{IN}$.

The configuring of the modulation ratio enhancement circuit 21 (shown in FIG. 7) as shown in FIG. 9A or 9B makes it possible to increase the modulation ratio of the extraction signal $I_{SIG}$ which is ASK-modulated with signal data.

Figure 10:
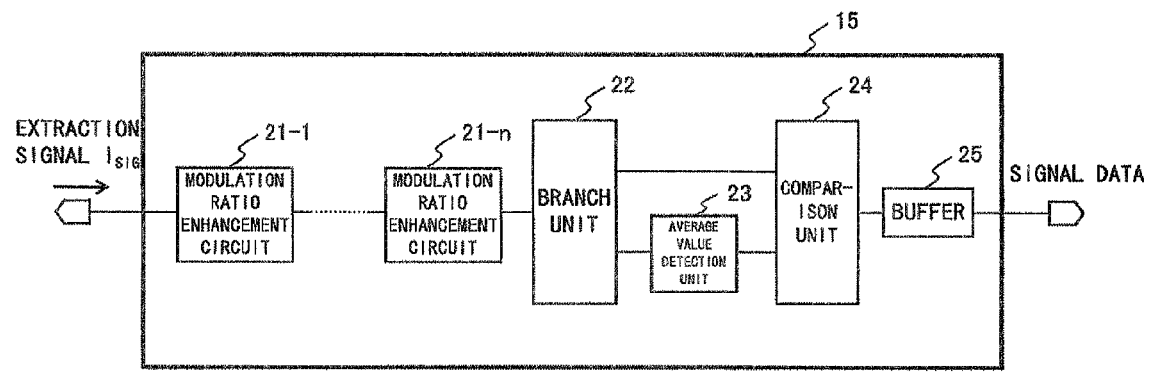
FIG. 10 is a block diagram showing a second example of the configuration of a demodulation circuit embodying the present invention.

Note that the demodulation circuit 15 used in the configuration shown in FIG. 5 may be configured to equip a plurality of modulation ratio enhancement circuits 21-1 through 21-n at the front stage of the branch unit 22 by connecting them in series as in the second example of the demodulation circuit 15 shown in FIG. 10, instead of configuring as shown in FIG. 6. This alternative configuration makes it possible to improve the degree of tolerance for a detection error against the maximum value of an extraction signal $I_{SIG}$ detected by the peak detection unit 32 in the configuration comprising the modulation ratio enhancement circuits 21-1 through 21-n which are shown in FIG. 7.

Assuming, for example, there is a ±40% error in detecting the maximum value of an extraction signal $I_{SIG}$ detected by the peak detection unit 32.

Here, let it first consider the case of configuring the demodulation circuit 15 as shown in FIG. 6, that is, it is equipped with only one stage of the modulation ratio enhancement circuit 21. The assumption in this case is that the subtraction unit 33 comprised by the modulation ratio enhancement circuit 21 subtracts a subtraction current, which is the current value as 0.75 times the maximum value of the extraction signal $I_{SIG}$ detected by the peak detection unit 32, from the original extraction signal $I_{SIG}$.

In this case, if there is a ±40% error in the detection by the peak detection unit 32, the current value of a subtraction current is 1.05 times (=0.75*(1+0.4)) the maximum value of the extraction signal $I_{SIG}$, thus exceeding one time (1×). As such, if the current value of a subtraction current exceeds one times the maximum value of an extraction signal $I_{SIG}$, the output of the subtraction unit 33, that is, that of the modulation ratio enhancement circuit 21 disappears.

In contrast, if there is a −40% error in the detection by the peak detection unit 32, the current value of a subtraction current is 0.45 times (=0.75*(1−0.4)) the maximum value of the extraction signal $I_{SIG}$. In this case, the improvement in the modulation ratio of the extraction signal $I_{SIG}$ performed by the modulation ratio enhancement circuit 21 remains at 1.8 times (=1/(1−0.45)).

Next, let it consider the case of configuring the demodulation circuit 15 as shown in FIG. 10, that is, it is equipped with a plurality of modulation ratio enhancement circuits 21-1 through 21-n being connected together in series. Here, the configuration is to equip two modulation ratio enhancement circuits 21 connected in series. In this case, the assumption is that the subtraction unit 33 comprised by the modulation ratio enhancement circuits 21 at each stage subtracts a subtraction current, which is the current value of 0.5 times the maximum value of the extraction signal $I_{SIG}$ detected by the peak detection unit 32, from the original extraction signal $I_{SIG}$.

In this case, even if there is a +40% error in the detection by the peak detection unit 32, the current value of a subtraction current in the modulation ratio enhancement circuit 21 at each stage is 0.7 times (=0.5*(1+0.4)) the maximum value of the extraction signal $I_{SIG}$ and hence it never exceeds one time (1×). Note that the improvement in the modulation ratio of the extraction signal $I_{SIG}$ by serially connecting the modulation ratio enhancement circuits 21 in this case is 11.1 times (={(1/(1−0.7))*{1/(1−0.7)}}).

In contrast, if there is a −40% error in the detection by the peak detection unit 32, the current value of a subtraction current in the modulation ratio enhancement circuit 21 at each stage is 0.3 times (=0.5*(1−0.4)) the maximum value of the extraction signal $I_{SIG}$. In this case, the improvement in the modulation ratio of the extraction signal $I_{SIG}$ by serially connecting the modulation ratio enhancement circuits 21 is 2.04 times (={1/(1−0.3)*{1/(1−0.3)}}, and therefore the effect on the improvement in the modulation ratio is higher than that of the configuration shown in FIG. 6.

As described above, it is possible to enhance the improvement effect on the modulation ratio of an extraction signal $I_{SIG}$ while improving the degree of tolerance for a detection error against the maximum value of the extraction signal $I_{SIG}$ detected by the peak detection unit 32 by equipping the demodulation circuit 15 with a plurality of modulation ratio enhancement circuits 21-1 through 21-n which are connected together in series.

Figure 11:
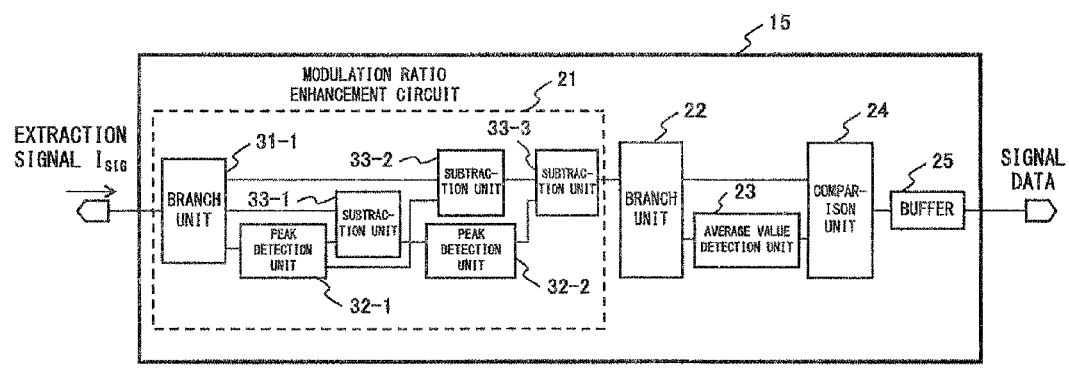
FIG. 11 is a block diagram showing a third example of the configuration of a demodulation circuit embodying the present invention.

Note that it is possible to enhance the degree of tolerance for a detection error against the maximum value of an extraction signal $I_{SIG}$ by configuring the demodulation circuit 15 by equipping a modulation ratio enhancement circuit 21 comprising as shown in FIG. 11 at the front stage of the branch unit 22 instead of configuring the demodulation circuit 15 by equipping the plurality of modulation ratio enhancement circuits 21-1 through 21-n as shown in FIG. 10, which are connected together in series, at the front stage of the branch unit 22.

Next is a description of the configuration of a modulation ratio enhancement circuit 21 comprised by the third example of a demodulation circuit 15 shown in FIG. 11. The modulation ratio enhancement circuit 21 shown in FIG. 11 comprises a branch unit 31-1, peak detection units 32-1 and 32-2, and subtraction units 33-1, 33-2 and 33-3. Here, the specific configurations of the peak detection units 32-1 and 32-2, and subtraction units 33-1, 33-2 and 33-3 may be the same as the respective configurations of the peak detection unit 32 and subtraction unit 33 which are shown in FIGS. 9A and 9B.

The branch unit 31-1 generates the same current signal as an extraction signal $I_{SIG}$ which is ASK-modulated with signal data and outputs it to the peak detection unit 32-1 and subtraction units 33-1 and 33-2. The specific circuit configuration of the branch unit 31-1 may be the same as, for example, the configuration shown in FIG. 12.

Describing the circuit of FIG. 12, the respective gates of transistors M30, M31, M32 and M33, which are p-MOS transistors, are connected to the drain of the transistor M31 and thereby a current mirror is formed between the transistor M30 and transistors M31 through M33. Further, a power supply voltage Vdd supplied from a rectification circuit 12, which is the power supply, is applied to the respective sources of the transistors M30, M31, M32 and M33. Here, the current signal $I_{IN}$ (that is, the extraction signal $I_{SIG}$) input to the branch unit 31-1 flows between the source and drain of the transistor M30 and therefore the transistors M31, M32 and M33 respectively generate mirror currents $I_{OUT1}$, $I_{OUT2}$ and $I_{OUT3}$, which are equal to the current value of the current signal $I_{IN}$, and send them from the respective drains. These mirror currents $I_{OUT1}$, $I_{OUT2}$ and $I_{OUT3}$ corresponding to the extraction signal $I_{SIG}$ flow to the peak detection unit 32-1 and subtraction units 33-1 and 33-2.

Now the description of FIG. 11 resumes.

The peak detection unit 32-1 detects the maximum value of the mirror current $I_{OUT1}$.

The subtraction unit 33-1 performs a subtraction in which the first subtraction current, which is a current being a constant times the maximum value of the mirror current IOUS detected by the peak detection unit 32-1, is subtracted from the mirror current $I_{OUT2}$.

Meanwhile, the subtraction unit 33-2 performs a subtraction in which the first subtraction current is subtracted from the mirror current $I_{OUT3}$.

The peak detection unit 32-2 detects the maximum value of the mirror current $I_{OUT2}$ after the first subtraction current is subtracted by the subtraction unit 33-1.

The subtraction unit 33-3 performs a subtraction in which a second subtraction current, which is a current being a constant times the maximum current value detected by the peak detection unit 32-2, is further subtracted from the mirror current $I_{OUT3}$ after the first subtraction current is subtracted by the subtraction unit 33-2. Then, a current as a result of the subtraction performed by the subtraction unit 33-3 is sent to the branch unit 22 and the original signal data is demodulated.

Comparing the modulation ratio enhancement circuit 21 shown in FIG. 11 with the configuration of the two-stage serial connection described above, the peak detection unit 32-2 comprised by the circuit shown in FIG. 11 corresponds to the peak detection unit 32 comprised by the circuit at the rear stage of the serial connection, and the subtraction unit 33-3 comprised by the circuit shown in FIG. 11 corresponds to the subtraction unit 33 comprised by the circuit at the rear stage. Further, the branch unit 31-1, peak detection unit 32-1 and either one of the subtraction units 33-1 and 33-2 constitute the configuration similar to the circuit at the front stage of the serial connection. That is, the circuit shown in FIG. 11 is configured to share the branch unit 31 and peak detection unit 32 and to equip with just two subtraction units 33, thereby configuring the aforementioned circuit at the front stage separately, in order to obtain a current signal constituting the inputs respectively to the peak detection unit 32 and subtraction unit 33 in the aforementioned circuit at the rear stage. Therefore, the modulation ratio enhancement circuit 21 shown in FIG. 11 operates in a similar manner to the above described configuration of the two-stage serial connection, thereby making it possible to enhance the improvement effect of the modulation ratio of an extraction signal $I_{SIG}$ while improving the degree of tolerance for a detection error against the maximum value of the extraction signal $I_{SIG}$.

As described above, the detection error against the maximum value of an extraction signal $I_{SIG}$, that is, the variation in the current value of a subtraction current, influencing on the operation of the modulation ratio enhancement circuit 21 is substantial. Accordingly, the control of the current value of a subtraction current is described next.

Figure 13A:
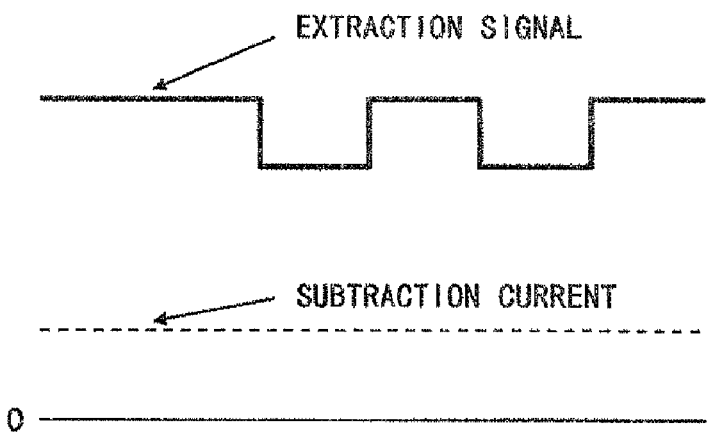
FIG. 13A is a diagram exemplifying the case of a subtraction current being too small relative to an extraction signal.
Figure 13B:
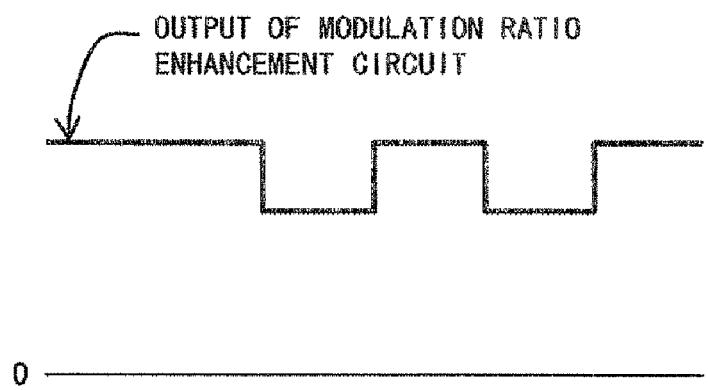
FIG. 13B is a diagram exemplifying an output signal of the modulation ratio enhancement circuit in the case of FIG. 13A.
Figure 13C:
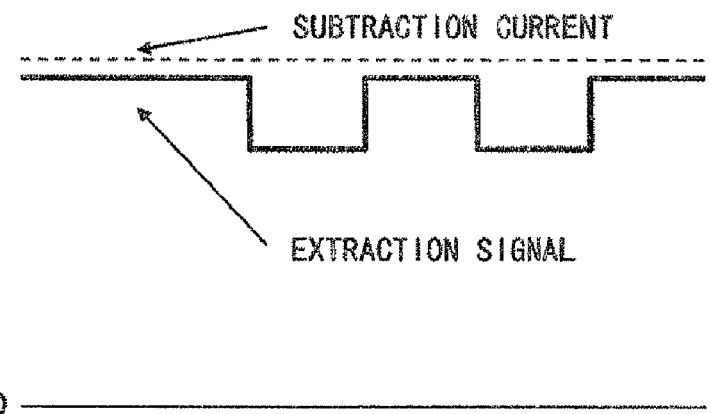
FIG. 13C is a diagram exemplifying the case of a subtraction current being too large relative to an extraction signal.
Figure 13D:
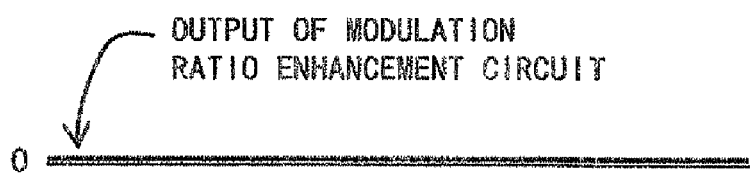
FIG. 13D is a diagram exemplifying an output signal of the modulation ratio enhancement circuit in the case of FIG. 13C.
Figure 13E:
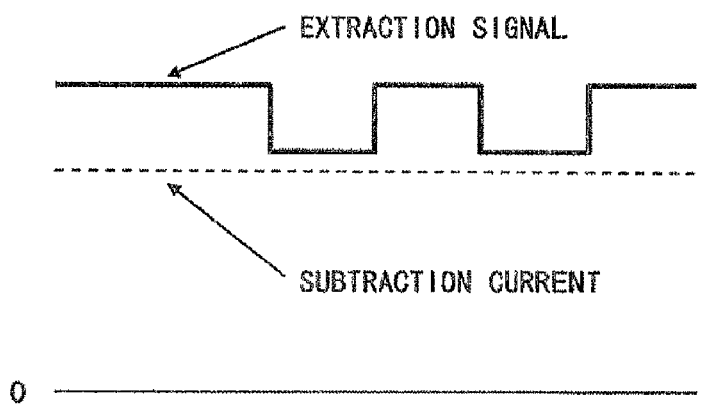
FIG. 13E is a diagram exemplifying the case of a subtraction current being appropriate relative to an extraction signal.
Figure 13F:
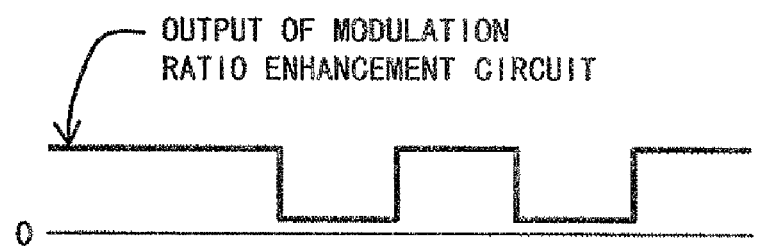
FIG. 13F is a diagram exemplifying an output signal of the modulation ratio enhancement circuit in the case of FIG. 13E.

As shown in FIG. 13A, if a subtraction current is too small relative to the extraction signal inputted to the modulation ratio enhancement circuit 21, the output signal thereof is as shown in FIG. 13B, making the improvement effect of the modulation ratio of the extraction signal being small. On the other hand, if a subtraction current is too large relative to the extraction signal input to the modulation ratio enhancement circuit 21 as shown in FIG. 13C and exceeds the maximum value of the extraction signal, the output signal of the modulation ratio enhancement circuit 21 becomes zero as shown in FIG. 13D. In contrast, if the current value of a subtraction current is appropriate relative to the extraction signal input to the modulation ratio enhancement circuit 21 as shown in FIG. 13E, the output signal thereof is as shown in FIG. 13F, making it possible to obtain a remarkable improvement effect of the modulation ratio. That is, it is possible to enhance the improvement effect of the modulation ratio of the extraction signal by controlling the current value of the subtraction current so as to make the output waveform the modulation ratio enhancement circuit 21 as close to the state shown in FIG. 13F as possible.

Next is a description of FIG. 14 which shows a fourth example of the demodulation circuit 15.

Referring to FIG. 14, a modulation ratio enhancement circuit 41, which is similar to the modulation ratio enhancement circuit 21 described above with a configuration little different therefrom as described later, is a circuit equipped with the function of increasing the modulation ratio of an extraction signal $I_{SIG}$ which is ASK-modulated with signal data.

A subtraction current volume control unit 42 is equipped for controlling the volume of a subtraction current on the basis of the result of comparing the magnitude of the maximum value of an extraction signal $I_{SIG}$ with that of the maximum value of a current after a subtraction current, which is a current being a constant times the maximum value of the aforementioned extraction signal $I_{SIG}$, is subtracted therefrom.

Incidentally, the branch unit 22, average value detection unit 23, comparison unit 24 and buffer 25 are similar to those comprised by the first example of the demodulation circuit 15 shown in FIG. 6.

Next is a description of FIG. 15 which exemplifies the specific circuit configuration of the modulation ratio enhancement circuit 41 and subtraction current volume control unit 42 which are shown in FIG. 14.

In the configuration of FIG. 14, transistors M11, M12 and M13 are p-MOS transistors, while transistors M14, M15, M16, M17, M40, M41, M42-1, M42-2 through M42-n are n-MOS transistors.

Referring to FIG. 14, the transistors M11, M12 and M13 constitute the same circuit as the branch unit 31 shown in FIG. 9A. Therefore, the transistors M12 and M13 respectively generate mirror currents Ia and Ib of which the current values are equal to the current value of a current signal $I_{IN}$ (that is, an extraction signal $I_{SIG}$) and send them from the respective drains.

Further in FIG. 14, the transistors M14 and M15, diode D11 and capacitor C11 constitute the same circuit as the peak detection unit 32 shown in FIG. 9A. These configurations therefore make it possible to detect the maximum value of the current signal $I_{IN}$ (that is, the extraction signal $I_{SIG}$) and obtain a subtraction current $I_{SUB}$ which is the present constant times the aforementioned maximum value.

Furthermore in FIG. 14, the transistors M16 and M17 constitute the same circuit as the subtraction unit 33 shown in FIG. 9A. These configurations therefore perform a subtraction in which the subtraction current $I_{SUB}$, which is the present constant times the maximum value of the current signal $I_{IN}$ (that is, the extraction signal $I_{SIG}$), is subtracted from the mirror current Ib of the aforementioned current signal $I_{IN}$.

The characteristics of the transistors M40 and M15 are unified. Here, the respective gates of the transistors M40 and M15 are connected together and the respective sources of are connected to a ground node. Therefore, a current corresponding to the gate voltage retained by the action of the capacitor C11, that is, a current of the same volume as the subtraction current $I_{SUB}$ flowing between the drain and source of the transistor M40, flows between the drain and source of the transistor M40.

Further, the respective gates of the transistors M16 and M41 are connected to the drain of the transistor M16 so that a current mirror is formed for the transistor M41. Here, the a current (i.e., $I_{IN}-I_{SUB}$, that is, the output signal $I_{OUT}$ of the modulation ratio enhancement circuit 41) which is a result of the subtraction current $I_{SUB}$ having been subtracted from the current signal $I_{IN}$, flows into the drain of the transistor M16 and therefore the current flowing between the drain and source of the transistor M41 is also the output signal $I_{OUT}$ which is the current as the result of the aforementioned subtraction. Incidentally, the respective sources of the transistors M16 and M41 are connected to the ground node.

The output signal $I_{OUT}$ output from the drain of the transistor M41 is input to a peak detection unit 61. The peak detection unit 61 detects and outputs the maximum current value of the output signal $I_{OUT}$ (i.e., the current after the subtraction current $I_{SUB}$ is subtracted from the current signal $I_{IN}$). Note that the specific circuit configuration of the peak detection unit 61 may be similar to that of, for example, the peak detection unit 32 shown in FIG. 9A.

A comparator 62 compares the magnitudes between the subtraction current $I_{SUB}$ flowing between the drain and source of the transistor M40 and the maximum current value of the output signal $I_{OUT}$ detected by the peak detection unit 61.

A logic control unit 63 controls the current volume of the subtraction current $I_{SUB}$ on the basis of the result of the aforementioned magnitude comparison performed by the comparator 62.

FIG. 16 is described at this time. FIG. 16 exemplifies the specific circuit configuration of the logic control unit 63. Incidentally in FIG. 16, a clock pulse of a prescribed frequency is input to the clock input.

Referring to FIG. 16, the comparison result of the comparator 62 is input to a flip-flop 71. Note that the comparator is configured to output "L" level if the maximum current value of the output signal $I_{OUT}$ is smaller than the subtraction current $I_{SUB}$, and to output "H" level if the maximum current value of the output signal $I_{OUT}$ is larger than the output signal $I_{OUT}$.

When the clock input is initiated, the flip-flop 71 outputs the comparison result already input from the comparator 62 at the time. The output comparison result is sent to the one input of a dual-input NAND circuit 72 and also to the one input of a dual-input NAND circuit 74 by way of an inverter 73. Note that the same clock as that input to the flip-flop 71 is input to the respective other inputs of the NAND circuits 72 and 74.

An up-down counter 75 counts up or down in accordance with the result of magnitude comparison performed by the comparator 62.

The output of the NAND circuit 72 is connected to the up-input of the up-down counter 75, and the output of the NAND circuit 74 is connected to the down-input of the up-down counter 75. The up-down counter 75 is a shift register which performs a left shift (except that "1" is substituted for the rightmost bit) of data by one bit at every time a count pulse is input to the up-input and performs a right shift (except that "0" is substituted for the leftmost bit) by one bit at every time a count pulse is input to the down-input. The up-down counter 75 outputs the content of the register for each digit so that the content constitutes a control signal output.

The logic control unit 63 is configured as described above. Therefore, count pulses are input to the down-input of the up-down counter 75 in accordance with the inputs of clock pulses during the period in which "L" level is input to the flip-flop 71 from the comparator 62, that is, during the period in which the maximum current value of the output signal $I_{OUT}$ is smaller than the subtraction current $I_{SUB}$ and therefore the control signal output of the "L" level is gradually increased. In contrast, count pulses are input to the up-input of the up-down counter 75 in accordance with the inputs of clock pulses during the period in which "H" level is input to the flip-flop 71 from the comparator 62, that is, during the period in which the maximum current value of the output signal $I_{OUT}$ is larger than the subtraction current $I_{SUB}$ and therefore the control signal output of the "H" level is gradually increased.

Now the description of FIG. 15 resumes.

Switches 51-1, 51-2 through 51-n, switches 52-1, 52-2 through 52-n, inverters 53-1, 53-2 through 53-n and transistors M42-1, M42-2 through M42-n constitute a subtraction unit for changing the volume of a subtraction current $I_{SUB}$ according to the count value of the up-down counter 75.

The control signal outputs from the logic control unit 63 (that is, the outputs of the up-down counter 75) are respectively sent to the open/close control terminals of the switches 51-1, 51-2 through 51-n and also to the open/close control terminals of the switches 52-1, 52-2 through 52-n by way of the inverters 53-1, 53-2 through 53-n, respectively. The switches 51-1, 51-2 through 51-n are serially connected to the switches 52-1, 52-2 through 52-n, respectively, and the serially connected switches are inserted between the gate of the transistor M15 and the ground node.

The respective gates of the transistors M42-1, M42-2 through M42-n are connected to the respective connection points between the switches 51-1, 51-2 through 51-n and switches 52-1, 52-2 through 52-n. Incidentally, the respective drains of the transistors M42-1, M42-2 through M42-n are connected to the drain of the transistor M15, and the respective sources of the transistors M42-1, M42-2 through M42-n are connected to the ground node.

Now, let it consider the case of an "L" level signal having been sent from the logic control unit 63 to the open/close control terminal of the switch 51-1. Considering the inverter 53-1 in this case, an "H" level signal has actually been sent to the open/close control terminal of the switch 51-1. In this case, the switch 51-1 is open and the switch 52-1 is short-circuited. The gate voltage of the transistor M42-1 is at a ground potential in this event, placing the transistor M42-1 in the Off state and no current flowing between the drain and source.

Next, let it consider the case of an "H" level signal having been sent from the logic control unit 63 to the open/close control terminal of the switch 51-1. Considering the inverter 53-1 in this case, an "L" level signal has actually been sent to the open/close control terminal of the switch 51-1. In this case, the switch 51-1 is short-circuited and the switch 52-1 is open. The gate voltage of the transistor M42-1 is equal to the gate voltage of the transistor M15 in this event. This prompts the transistor M42-1 to shift to the On state in this case, and a current flows between the drain and source thereof. That is, the subtraction current $I_{SUB}$ shown in FIG. 15 is actually the sum of the currents flowing between the respective drains and sources of the transistors M15 and M42-1 and thus increases in the current volume.

The respective combinations of the switches 51-2 through 51-n, switches 52-2 through 52-n, inverters 53-2 through 53-n and transistors M42-2 through M42-n operate in a manner similar to the circuit of the above described combination of the switches 51-1 and 52-1, inverter 53-1, and transistor M42-1. Therefore, in the period in which the "L" level outputs are gradually increased among the control signal outputs of the logic control unit 63, that is, in the period in which the maximum current value of the output signal $I_{OUT}$ is smaller than the subtraction current $I_{SUB}$, the number of Off-state transistors, among the transistors M42-1, M42-2 through M42-n, is gradually increased, thus resulting in the subtraction current $I_{SUB}$ being gradually decreased. In contrast, in the period in which the "H" level outputs are gradually increased among the control signal outputs of the logic control unit 63, that is, in the period in which the maximum current value of the output signal $I_{OUT}$ is larger than the subtraction current $I_{SUB}$, the number of On-state transistors, among the transistors M42-1, M42-2 through M42-n, is gradually increased, thus resulting in the subtraction current $I_{SUB}$ being gradually increased.

Figure 3:
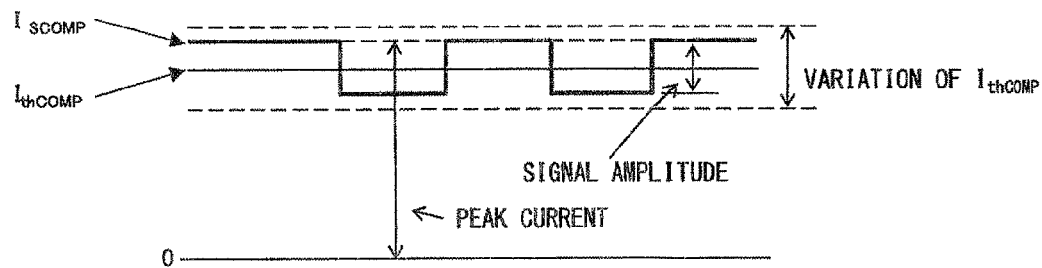
FIG. 3 is a diagram describing the problem embraced by the conventional demodulation circuit.
Figure 4:
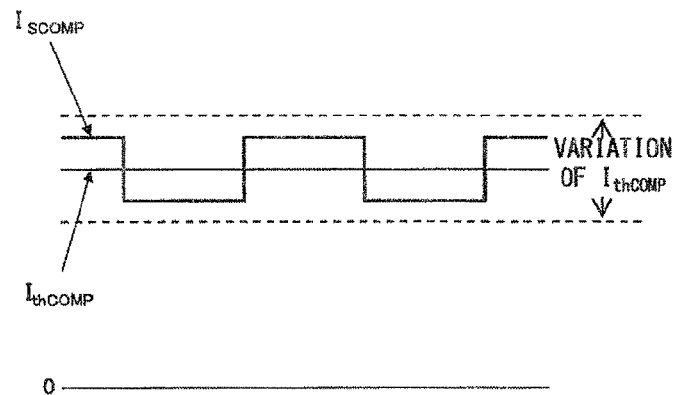
FIG. 4A is a diagram showing the relationship between a current $I_{SCOMP}$ and a threshold current $I_{thCOMP}$ before amplification.
FIG. 4B is a diagram showing the relationship between a current $I_{SCOMP}$ and a threshold current $I_{thCOMP}$ after amplification.
Figure 4B:
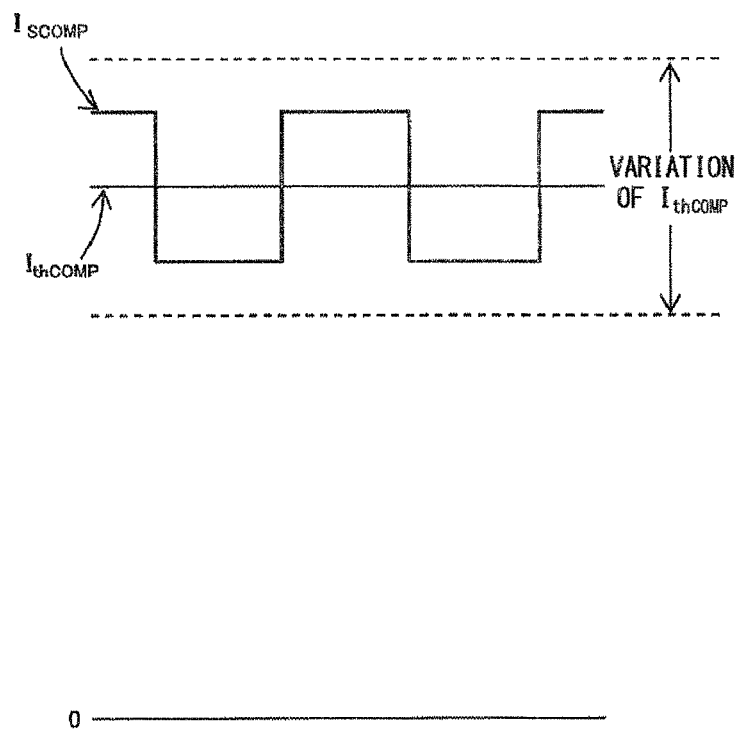

As described thus far, in the circuit shown in FIG. 15, the subtraction current volume control unit 42 decreases the volume of the subtraction current $I_{SUB}$ if the maximum value of the current (that is, the output signal $I_{OUT}$) which is a result of the subtraction current $I_{SUB}$ being subtracted from the current signal $I_{IN}$ is smaller than the subtraction current $I_{SUB}$. On the other hand, it performs the control of increasing the volume of the subtraction current $I_{SUB}$ if the maximum value of the current which is a result of the subtraction current $I_{SUB}$ being subtracted from the current signal $I_{IN}$ is larger than the subtraction current $I_{SUB}$. As a result, the output signal $I_{OUT}$ of the modulation ratio enhancement circuit 21 never becomes the state as shown in FIG. 3B or 3D, and instead becomes close to the state of FIG. 13F, and therefore the improvement effect of the modulation ratio of the extraction signal $I_{SIG}$ is enhanced.

As such, the preferred embodiments of the present invention have been described. Note that the present invention, however, allows various improvements and/or changes within the scope thereof, in lieu of being limited to the individual embodiments described above.

As an example, the above described embodiments use MOS transistor (i.e., MOSFET) as an individual transistor, instead, it is also possible to configure a demodulation circuit 15 by using a metal semiconductor (MES) FET, a metal insulator semiconductor (MIS) FET or a bipolar transistor.

The above described embodiments enable the demodulation of signal data after increasing the modulation ratio of the current signal, thereby making it possible to demodulate more securely an ASK modulation signal of which the modulation ratio is small.

The above described embodiments may also be configured such that the modulation ratio enhancement unit comprises a maximum value detection unit for detecting the maximum value of the current signal, and a subtraction unit for subtracting a subtraction current, which is a current of the maximum value multiplied by a constant, from the current signal.

The above described embodiments make it possible to increase the modulation ratio of a current signal.

In the above noted case, the configuration may also be such that the modulation ratio enhancement unit further comprises a current mirror for generating a mirror current corresponding to the current signal, wherein the subtraction unit subtracts the subtraction current from the mirror current.

The above noted demodulation circuit according to the above described embodiments may also comprise a plurality of the modulation ratio enhancement units, which are serially connected together.

This configuration makes it possible to enhance the improvement effect of the modulation ratio of a current signal.

The above noted demodulation circuit according to the above described embodiments may also be configured such that the modulation ratio enhancement unit comprises a current mirror for generating first, second and third mirror currents corresponding to the current signal; a first maximum value detection unit for detecting the maximum value of the first mirror current; a first subtraction unit for subtracting, from the second mirror current, a first subtraction current, which is a current as a result of multiplying the maximum value of the first mirror current, which is detected by the first maximum value detection unit, by a constant; a second subtraction unit for subtracting the first subtraction current from the third mirror current; a second maximum value detection unit for detecting the maximum value of a current after the first subtraction current is subtracted by the first subtraction unit; and a third subtraction unit for further subtracting, from a current after the first subtraction current is subtracted by the second subtraction unit, a second subtraction current, which is a current as a result of multiplying the maximum value, which is detected by the second maximum value detection unit, by a constant, wherein the demodulation unit demodulates the signal data from a current after being subtracted by the third subtraction unit.

Also this configuration makes it possible to enhance the improvement effect of the modulation ratio of a current signal.

The above noted demodulation circuit according to the above described embodiments may also comprise a subtraction current volume control unit for controlling the volume of the subtraction current on the basis of the result of comparing the magnitude of the aforementioned subtraction current with that of the maximum value of a current subtracted by the subtraction unit.

This configuration enables the quantity of the subtraction current to be appropriate.

In the above noted case, the configuration may also be such that the subtraction current volume control unit performs the control of decreasing the volume of the subtraction current if the maximum value of a current after being subtracted by the subtracting unit is smaller than the aforementioned subtraction current and increasing the volume of the aforementioned subtraction current if the maximum value of the current after being subtracted by the subtracting unit is larger than the subtraction current.

This configuration enables the quantity of the subtraction current to be appropriate, thereby making it possible to enhance the improvement effect of the modulation ratio of a current signal.

In the above noted case, the configuration may also be such that the subtraction current volume control unit comprises a post-subtraction current maximum value detection unit for detecting the maximum value of a current after being subtracted by the subtraction unit, a comparator for comparing the magnitude of the subtraction current with that of the maximum value detected by the post-subtraction current maximum value detection unit, and an up-down counter for performing a count-up or a count-down in accordance with the result of the magnitude comparison performed by the comparator, wherein the subtraction unit changes the volume of the subtraction current in accordance with the count value counted by the up-down counter.

This configuration enables the quantity of the subtraction current to be appropriate.

It shall be noted that an RFID tag and a noncontact IC card, which comprise the above described demodulation circuit according to the present invention, are also within the scope thereof.

What is claimed is:

1. A demodulation circuit, comprising:
   a modulation ratio enhancement unit to increase the modulation ratio of a current signal which is amplitude shift keying modulated with signal data; and
   a demodulation unit to demodulate the signal data from the current signal, of which the modulation ratio is increased by the modulation ratio enhancement unit,
   wherein said modulation ratio enhancement unit further comprises
   a current mirror to generate first, second and third mirror currents corresponding to said current signal;
   a first maximum value detection unit to detect the maximum value of the first mirror current;
   a first subtraction unit to subtract, from the second mirror current, a first subtraction current, which is a current as a result of multiplying the maximum value of the first mirror current, which is detected by the first maximum value detection unit, by a constant;
   a second subtraction unit to subtract the first subtraction current from the third mirror current;
   a second maximum value detection unit to detect the maximum value of a current after the first subtraction current is subtracted by the first subtraction unit; and
   a third subtraction unit to further subtract, from a current after the first subtraction current is subtracted by the second subtraction unit, a second subtraction current, which is a current as a result of multiplying the maximum value, which is detected by the second maximum value detection unit, by a constant, wherein
   said demodulation unit demodulates said signal data from a current after being subtracted by the third subtraction unit.

2. The demodulation circuit according to claim 1, comprising
   a plurality of said modulation ratio enhancement units, which are serially connected together.

3. A demodulation circuit, comprising:
   a modulation ratio enhancement unit to increase the modulation ratio of a current signal which is amplitude shift keying modulated with signal data;
   a demodulation unit to demodulate the signal data from the current signal, of which the modulation ratio is increased by the modulation ratio enhancement unit;
   a maximum value detection unit to detect the maximum value of said current signal;
   a subtraction unit to subtract a subtraction current, which is a current of the maximum value multiplied by a constant, from the current signal; and
   a subtraction current volume control unit to control the volume of said subtraction current on the basis of the result of comparing the magnitude of the aforementioned subtraction current with that of the maximum value of a current subtracted by said subtraction unit.

4. The demodulation circuit according to claim 3, wherein said subtraction current volume control unit performs the control of decreasing the volume of said subtraction current if the maximum value of a current after being subtracted by said subtracting unit is smaller than the aforementioned subtraction current and increasing the volume of the aforementioned subtraction current if the maximum value of the current after being subtracted by said subtracting unit is larger than the subtraction current.

5. The demodulation circuit according to claim 3, wherein said subtraction current volume control unit comprises
   a post-subtraction current maximum value detection unit to detect the maximum value of a current after being subtracted by said subtraction unit,
   a comparator to compare the magnitude of said subtraction current with that of the maximum value detected by the post-subtraction current maximum value detection unit, and
   an up-down counter to perform a count-up or a count-down in accordance with the result of the magnitude comparison performed by the comparator, wherein
   the subtraction unit changes the volume of the subtraction current in accordance with the count value counted by the up-down counter.

6. A radio frequency identification tag comprising a demodulation circuit, wherein the demodulation circuit comprises:
   a modulation ratio enhancement unit to increase the modulation ratio of a current signal which is amplitude shift keying modulated with signal data; and
   a demodulation unit to demodulate the signal data from the current signal, of which the modulation ratio is increased by the modulation ratio enhancement unit,
   wherein said modulation ratio enhancement unit further comprises:
   a current mirror to generate first, second and third mirror currents corresponding to said current signal;
   a first maximum value detection unit to detect the maximum value of the first mirror current;
   a first subtraction unit to subtract, from the second mirror current, a first subtraction current, which is a current as a result of multiplying the maximum value of the first mirror current, which is detected by the first maximum value detection unit, by a constant;
   a second subtraction unit to subtract the first subtraction current from the third mirror current;
   a second maximum value detection unit to detect the maximum value of a current after the first subtraction current is subtracted by the first subtraction unit; and
   a third subtraction unit to further subtract, from a current after the first subtraction current is subtracted by the second subtraction unit, a second subtraction current, which is a current as a result of multiplying the maximum value, which is detected by the second maximum value detection unit, by a constant, wherein said demodulation unit demodulates said signal data from a current after being subtracted by the third subtraction unit.

7. A noncontact integrated circuit card comprising a demodulation circuit, wherein the demodulation circuit comprises:

a modulation ratio enhancement unit to increase the modulation ratio of a current signal which is amplitude shift keying modulated with signal data, and a demodulation unit to demodulate the signal data from the current signal, of which the modulation ratio is increased by the modulation ratio enhancement unit, wherein said modulation ratio enhancement unit further comprises a current mirror for generating first, second and third mirror currents corresponding to said current signal;

a first maximum value detection unit to detect the maximum value of the first mirror current;

a first subtraction unit to subtract, from the second mirror current, a first subtraction current, which is a current as a result of multiplying the maximum value of the first mirror current, which is detected by the first maximum value detection unit, by a constant;

a second subtraction unit to subtract the first subtraction current from the third mirror current;

a second maximum value detection unit to detect the maximum value of a current after the first subtraction current is subtracted by the first subtraction unit; and a third subtraction unit to further subtract, from a current after the first subtraction current is subtracted by the second subtraction unit, a second subtraction current, which is a current as a result of multiplying the maximum, which is detected by the second maximum value detection unit, by a constant, wherein said demodulation unit demodulates said signal data from a current after being subtracted by the third subtraction unit.

8. The noncontact integrated circuit card according to claim 7, wherein said demodulation circuit further comprises a subtraction current volume control unit to control the volume of said subtraction current on the basis of the result of comparing the magnitude of the aforementioned subtraction current with that of the maximum value of a current subtracted by said subtraction unit.

* * * * *